(12) United States Patent
Kaneko

(10) Patent No.: US 10,375,841 B2
(45) Date of Patent: Aug. 6, 2019

(54) ELECTRONIC CONTROL DEVICE

(71) Applicant: Hitachi Automotive Systems, Ltd., Hitachinaka-shi, Ibaraki (JP)

(72) Inventor: Susumu Kaneko, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/552,457

(22) PCT Filed: Feb. 5, 2016

(86) PCT No.: PCT/JP2016/053503
§ 371 (c)(1),
(2) Date: Aug. 21, 2017

(87) PCT Pub. No.: WO2016/147737
PCT Pub. Date: Sep. 22, 2016

(65) Prior Publication Data
US 2018/0035555 A1    Feb. 1, 2018

(30) Foreign Application Priority Data

Mar. 18, 2015    (JP) .................................. 2015-054116

(51) Int. Cl.
*H05K 5/02*    (2006.01)
*H05K 5/00*    (2006.01)
(Continued)

(52) U.S. Cl.
CPC ....... *H05K 5/0017* (2013.01); *B60R 16/0231* (2013.01); *B60T 8/34* (2013.01);
(Continued)

(58) Field of Classification Search
None
See application file for complete search history.

(56) References Cited

U.S. PATENT DOCUMENTS 5,993,255 A * 11/1999 Yurko .................. H01R 13/631
                                                                439/364
6,091,604 A *  7/2000 Plougsgaard ......... H02M 7/003
                                                                165/185
(Continued)

FOREIGN PATENT DOCUMENTS

JP    2-23691 A    1/1990
JP    2-79082 U    6/1990
(Continued)

OTHER PUBLICATIONS

Japanese-language Office Action issued in counterpart Japanese Application No. 2015-054116 dated Apr. 3, 2018 (three (3) pages).
(Continued)

*Primary Examiner* — Xanthia C Cunningham
(74) *Attorney, Agent, or Firm* — Crowell & Moring LLP

(57) ABSTRACT

Electronic control device has case, circuit board and cover. Case bottom wall section has insertion guide rising up from top surface thereof. Insertion guide has guide hole in top section wall, through which terminal of solenoid coil is inserted, and guide groove surrounding at least three sides of terminal is formed to be continuous with guide hole. Terminal is inserted into insertion hole through guide groove from the bottom section of insertion guide, is guided to guide hole by guide groove, and projects from insertion guide through guide hole. Top section wall and circuit board are adjacent, and through hole is disposed directly above guide hole, thereby terminal projecting from insertion guide is guided to and inserted into through hole.

15 Claims, 15 Drawing Sheets

(51) Int. Cl.
  *B60T 8/34* (2006.01)
  *B60R 16/023* (2006.01)
  *H01R 12/70* (2011.01)
  *B60T 8/36* (2006.01)
  *H05K 3/30* (2006.01)

(52) U.S. Cl.
  CPC .......... *B60T 8/368* (2013.01); *H01R 12/7005* (2013.01); *H05K 5/006* (2013.01); *H05K 5/0065* (2013.01); *H05K 5/0247* (2013.01); *H05K 3/306* (2013.01)

(56) References Cited

U.S. PATENT DOCUMENTS

| | | | | |
|---|---|---|---|---|
| 7,635,046 | B2* | 12/2009 | Tominaga | B62D 5/0406 180/444 |
| 8,385,078 | B2* | 2/2013 | Ibori | H02M 7/003 361/742 |
| 2002/0121809 | A1* | 9/2002 | Kameyama | H01R 9/226 307/9.1 |
| 2003/0188882 | A1* | 10/2003 | Asao | H01R 13/4538 174/541 |
| 2010/0051614 | A1* | 3/2010 | Sathyanarayana | H02G 3/081 220/3.2 |
| 2010/0105223 | A1* | 4/2010 | Taguchi | H01R 4/305 439/76.2 |
| 2010/0265429 | A1* | 10/2010 | Tsutsumi | H05K 5/0017 349/58 |
| 2011/0201216 | A1* | 8/2011 | Miyamoto | B60R 25/00 439/76.2 |
| 2011/0250782 | A1* | 10/2011 | Van Stiphout | H01R 4/2433 439/395 |
| 2012/0067612 | A1* | 3/2012 | Wagner | H02G 3/081 174/51 |
| 2012/0228970 | A1* | 9/2012 | Patel | H02K 5/225 310/71 |
| 2012/0252234 | A1* | 10/2012 | Kobayashi | B60R 16/0238 439/76.2 |
| 2014/0124259 | A1* | 5/2014 | Dean | H02G 3/18 174/481 |
| 2014/0134897 | A1* | 5/2014 | Akuta | H01R 9/18 439/782 |
| 2014/0162486 | A1* | 6/2014 | Yasui | H01R 4/38 439/359 |
| 2014/0265749 | A1 | 9/2014 | Motoda et al. | |
| 2014/0287630 | A1* | 9/2014 | Hoppmann | H01R 4/4818 439/729 |
| 2015/0244087 | A1* | 8/2015 | Wing | H01R 9/2408 439/722 |
| 2015/0303666 | A1* | 10/2015 | Shimizu | H02G 3/16 361/752 |
| 2015/0380913 | A1* | 12/2015 | Roberts | H02G 3/085 248/231.91 |
| 2016/0064880 | A1* | 3/2016 | Parnapy | H02G 3/081 174/549 |
| 2016/0091682 | A1* | 3/2016 | Wakileh | G02B 6/445 385/135 |
| 2018/0054048 | A1* | 2/2018 | Trimble | H02G 3/14 |
| 2018/0065576 | A1* | 3/2018 | Kawaguchi | B60R 16/0238 |

FOREIGN PATENT DOCUMENTS

| | | |
|---|---|---|
| JP | 2007-331701 A | 12/2007 |
| JP | 2014-177209 A | 9/2014 |

OTHER PUBLICATIONS

International Search Report (PCT/ISA210) issued in PCT Application No. PCT/JP2016/053503 dated May 10, 2016 with English translation (five pages).

Japanese-language Written Opinion (PCT/ISA/237) issued in PCT Application No. PCT/JP2016/053503 dated May 10, 2016 (three pages).

\* cited by examiner

ELECTRONIC CONTROL DEVICE

TECHNICAL FIELD

The present invention relates to an electronic control device in which electronic components such as a solenoid coil are arranged at a case side.

BACKGROUND TECHNOLOGY

For example, as an electronic control device for a vehicle brake controller, one described in a patent document 1 has been known. The electronic control device of the patent document 1 is one for performing operation control of, for example, a solenoid selector valve and a motor, for anti-lock brake control, and has a coil carrier accommodating a plurality of coils of the solenoid selector valves and a circuit board provided with a circuit for the drive of the solenoid selector valves, and these are accommodated in a housing.

The coil carrier has a box-shape having opened side surfaces, and eight coils are accommodated in the inside of the coil carrier. In addition, eight insertion holes through which terminals of the coils are inserted are opened through the top surface of the coil carrier which is opposed to the circuit board. Each of the coils has two terminals, and the coils are arranged in the coil carrier so that the two terminals of each of the coils are inserted through one insertion hole. The terminal extends through the top surface through the insertion hole from a side at which the coil is accommodated, and the tip end part of the terminal is soldered, and the coil is fixed to the circuit board.

PRIOR ART REFERENCE

Patent Document

Patent Document 1: Japanese Patent Application Publication 2007-331701

SUMMARY OF THE INVENTION

Problem to be Solved by the Invention

The plurality of the terminals project from the coil carrier, and it is necessary to insert all of them into the through holes with terminal groups of other electronic components. However, the device described in the patent document 1 is not provided with guide members to support and guide the terminals to the through holes. It is therefore difficult to smoothly insert all of the terminals into the through holes because variations in the distance between the terminals occur in each coil. In addition, there is a problem that the terminal is deformed depending on an assembling method.

Means for Solving the Problem

An electronic control device according to the present invention includes: a case made of synthetic resin; and a circuit board fixed to the case, wherein the case includes a first surface opposite to the circuit board and a second surface on an opposite side to the first surface, wherein a terminal of an electronic component disposed on the second surface is fixed to a through hole of the circuit board through the case, wherein the first surface is formed with an insertion guide rising up in the form of a concave shape from the first surface toward the circuit board, and wherein a guide hole through which the terminal is inserted is opened on a top section wall of the insertion guide.

Effect of the Invention

According to the present invention, the top section wall provided with the guide hole, and the circuit board are adjacent, and therefore it is possible to smoothly insert the terminal of the electronic component disposed in the case into the through hole of the circuit board, and assembling workability can be improved.

MODE FOR IMPLEMENTING THE INVENTION

With reference to the drawings, an embodiment of the present invention will be explained in detail. The following embodiment is one in which the present invention has been applied to an electronic control device 1 configuring an electronic stability control (ESC) for vehicles.

In addition, in the following explanation, terms, such as "upper", "lower", "front" and "back", are used based on the attitude of the electronic control device 1 in FIG. 1 to facilitate understanding. The attitude of the electronic control device 1 of the present invention is, however, not limited to the attachment attitude of FIG. 1.

Figure 1:
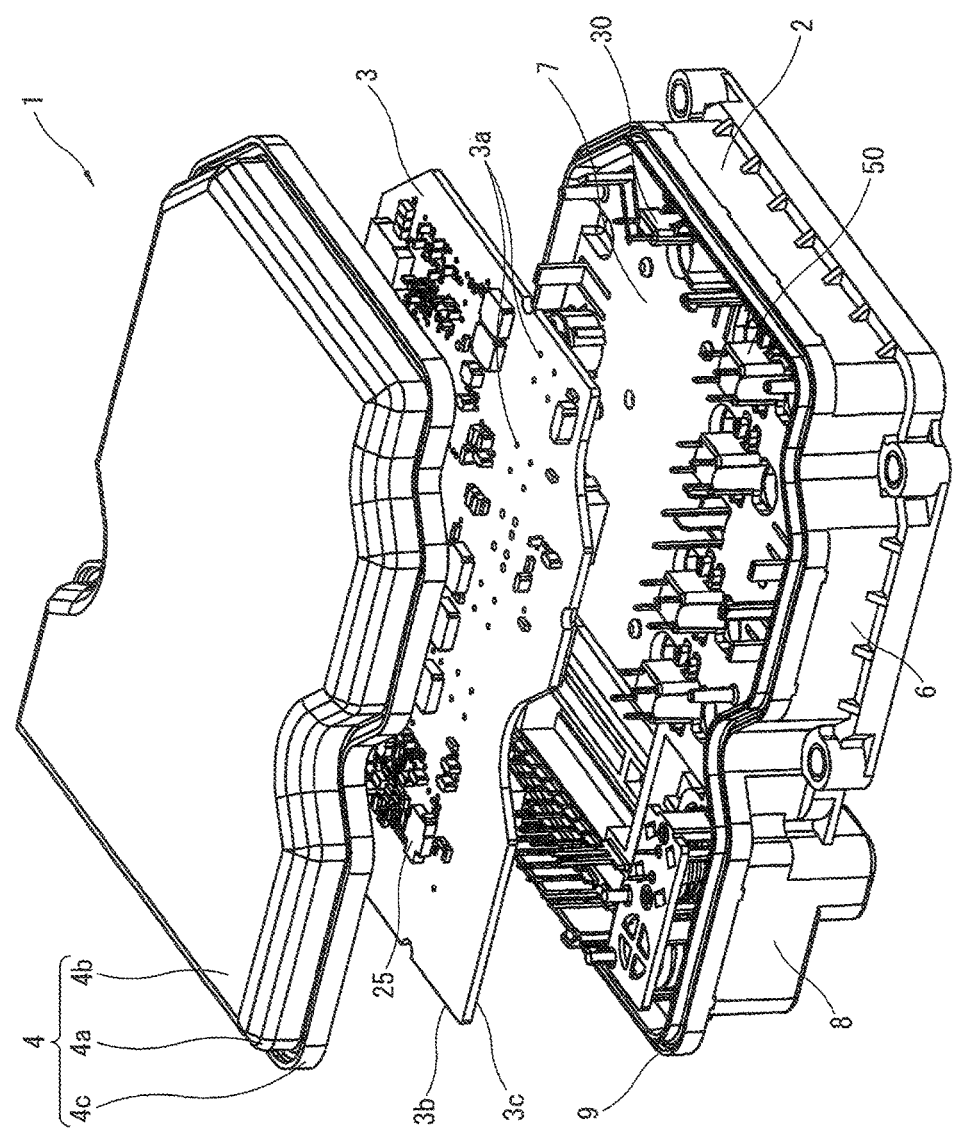
FIG. 1 is a perspective exploded view schematically showing an electronic control device according to the present invention.

With reference to FIG. 1, the basic configuration of the whole electronic control device 1 will be explained. The electronic control device 1 has a case 2 made of synthetic resin, a circuit board 3 attached to the case 2, and a cover 4 attached to the case 2 so as to cover the circuit board 3.

Figure 2:
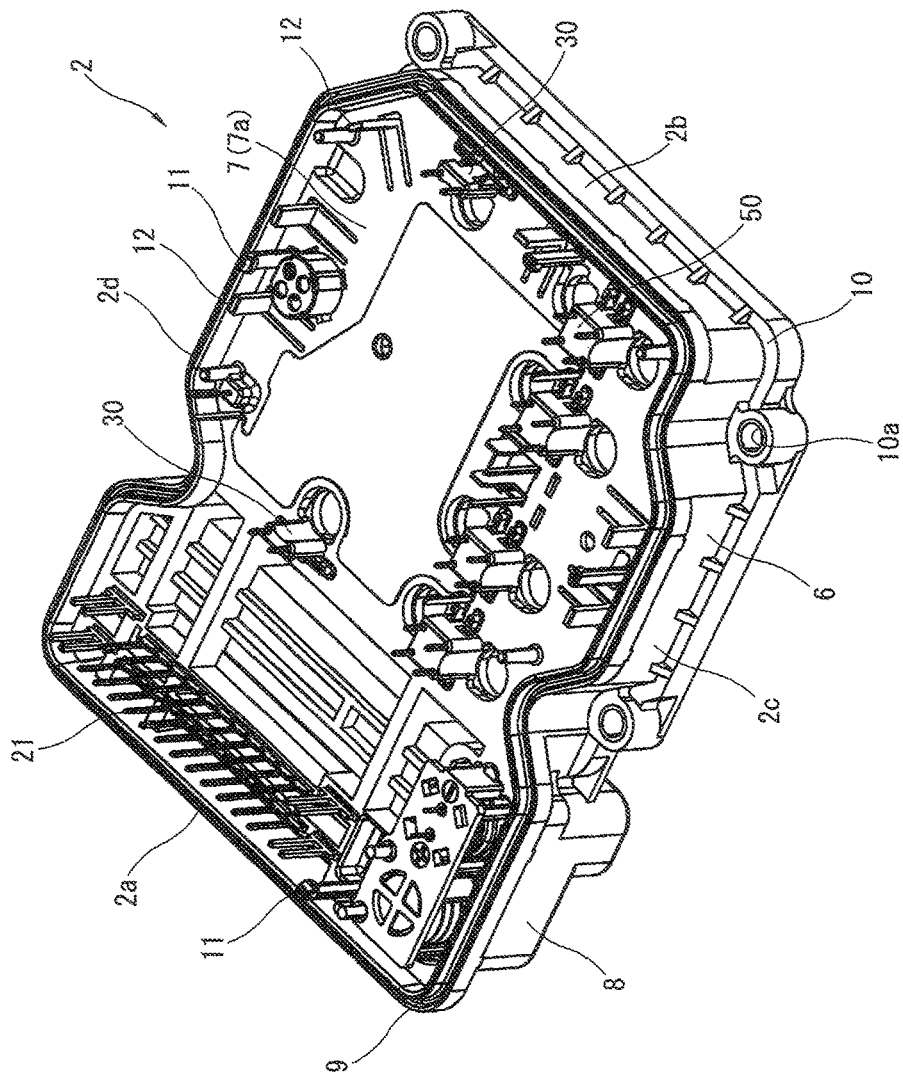
FIG. 2 is a perspective view of a case of the electronic control device according to the present invention.
Figure 4:
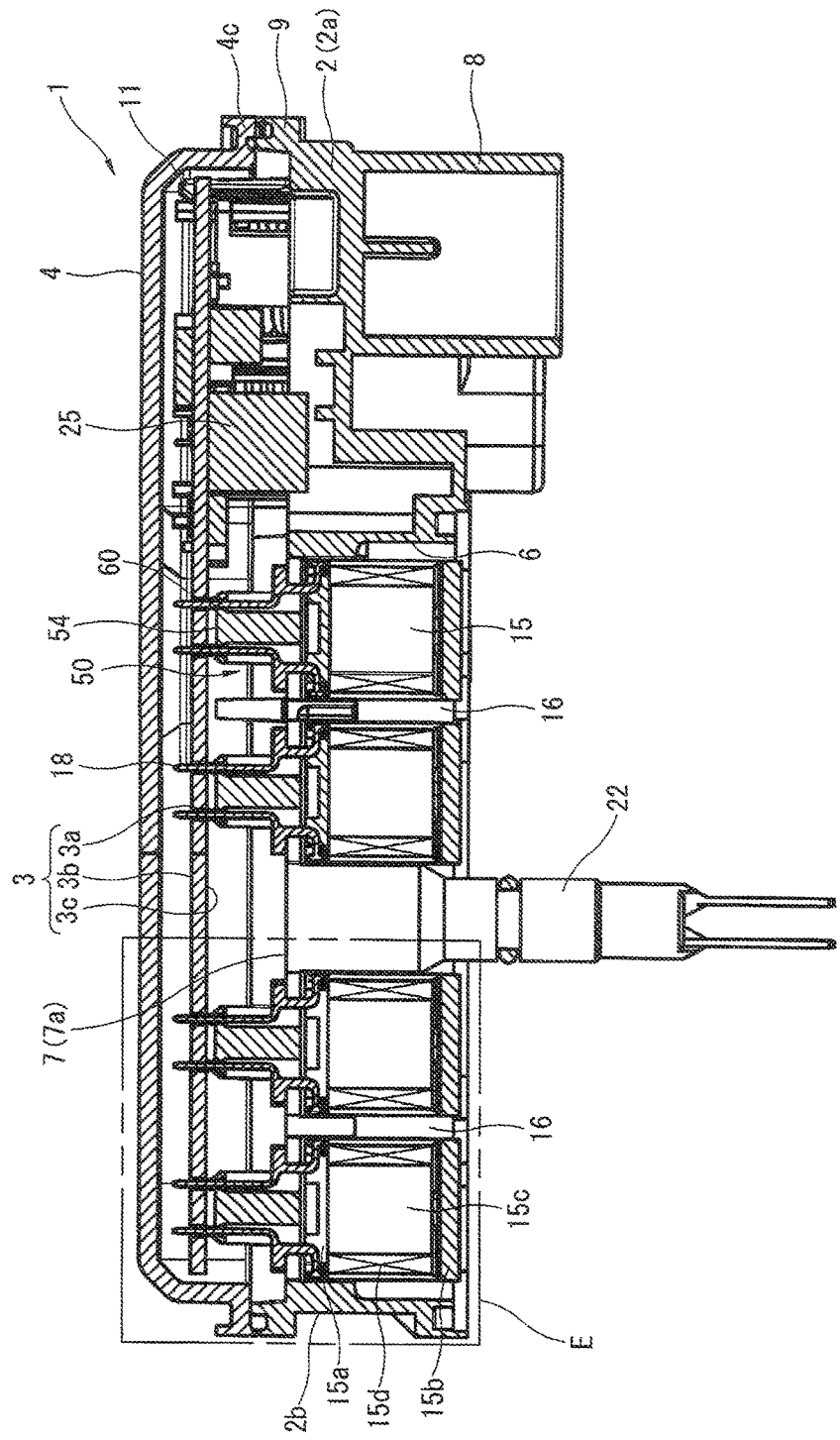
FIG. 4 is a sectional view of the electronic control device taken along a line A-A of FIG. 3.

As shown in FIG. 2 and FIG. 4, the case 2 formed in a substantially rectangular shape has a peripheral wall section 6 vertically erected so as to surround the four sides at the upper surface side of a hydraulic unit which is not shown in the drawings, a plate-like bottom wall section 7 extending between a first side part 2a and a second side part 2b of the case 2, and a connector portion 8 formed in a substantially rectangular shape which is provided so as to extend sideways from the peripheral wall section 6 in the first side part 2a side. The outer edge of the case 2 is provided with an engaging section 9 rising up toward the cover 4.

As shown in FIG. 2, the peripheral wall section 6 having a shape corresponding to the hydraulic unit is formed with a flange section 10 formed along the outer periphery of the lower end part of the peripheral wall section 6, and a bolt insertion hole 10a through which a bolt to screw the case 2 to the hydraulic unit is inserted is vertically formed at each of the four corners of the peripheral wall section 6.

Figure 3:
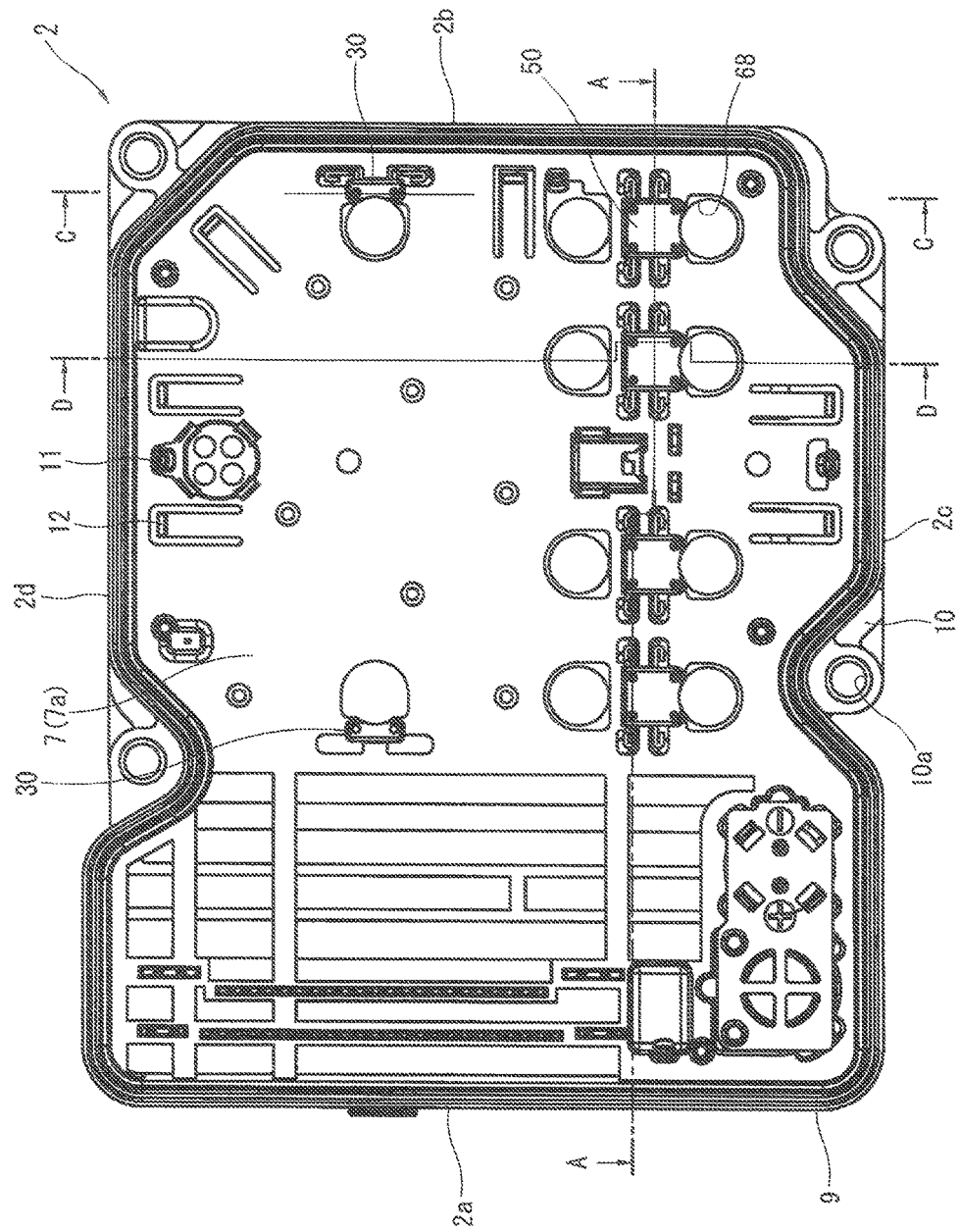
FIG. 3 is a top view of the case according to the present invention.

As shown in FIG. 2 to FIG. 4, the bottom wall section 7 has an upper surface (a first surface in the present invention) 7a opposite to the circuit board 3 and a lower surface (a second surface in the present invention) 7b positioned on an opposite side to the upper surface 7a. A snap fit portion 11 to hold the circuit board 3 is erected at each of four positions along the engaging section 9. In addition, a support piece 12 is erected at each of both the sides of the snap fit portion 11 erected at each of a front side part 2c and a back side part 2d of the case 2. Moreover, the support piece 12 is erected at one side (a back side part 2d side) of the snap fit portion 11 erected at the second side part 2b. In addition, one support piece 12 is erected at a corner portion defined between the back side part 2d and the second side part 2b. That is, six support pieces 12 are formed along the peripheral edge of the three sides of the bottom wall section 7. Furthermore, two first insertion guides 30 and four second insertion guides 50 which will be mentioned below are formed on the bottom wall section 7 so as to project from the upper surface 7a toward the circuit board 3 side.

As shown in FIG. 4, ten coil accommodating parts 16 to accommodate respective solenoid coils 15 (electronic components in the present invention) of solenoid selector valves are defined as a rectangular concave part at the lower surface 7b of the bottom wall section 7. The solenoid coil 15 has a cylindrical portion 15c having rectangular end portions 15a and 15b, and a coil 15d is wound around the cylindrical portion 15c, and two terminals 18 projects from one side portion of the solenoid coil 15. The terminal 18 of the solenoid coil 15 arranged in the coil accommodating part 16 extends through the bottom wall section 7, and projects from the top part of each of the insertion guides 30 and 50. In addition, as shown in FIG. 2, a plurality of terminal groups 21 connected to a power connector, a motor connecter and a signal connector project from the upper surface 7a through the bottom wall section 7 (see FIG. 2). Moreover, a motor post 22 connecting the circuit board 3 to a motor which is not shown in the drawings is provided on the lower surface 7b.

As shown in FIG. 1 and FIG. 4, the circuit board 3 made of a resin board or a metal board is formed in a substantially rectangular thin plate shape along the outer shape of the cease 2, and is mounted with a plurality of electronic components 25 including microcomputers. In addition, a circuit pattern is formed on the circuit board 3. Moreover, a plurality of connector terminal holes are opened on the circuit board 3. Terminals such as the terminal groups 21 are inserted through these holes, and by soldering, these terminals are connected. In addition, a plurality (for example, twenty) of through holes 3a through which the respective terminals 18 of the solenoid coils 15 are inserted are opened on the circuit board 3. The terminal 18 is inserted into the through hole 3a, and is fixed to the circuit board 3 by soldering. The circuit board 3 configured as above is mounted on the support pieces 12, and by pressing the peripheral edge part of the upper surface 3b with claw portions provided at the respective upper ends of the snap fit portions 11, the circuit board 3 is fixed between the support pieces 12 and the claw portions, and is attached to the case 2.

The cover 4 made of synthetic resin or metal is formed in a substantially rectangular shape along the outer shape of the case 2, and as shown in FIG. 1, it is formed of an outer peripheral section 4a and a flat lid section 4b closing one end surface of the outer peripheral section 4a. The peripheral edge of the end part of the outer peripheral section 4a in the cover 4 is formed with a flange section 4c protruding outward. The flange section 4c contacts the engaging section 9 of the case 2, and the cover 4 is attached to the case 2 with a predetermined method. The cover 4 made of metal may be used to secure heat dissipation and noise resistance.

Next, with reference to FIG. 2 to FIG. 8, the first insertion guide 30 will be explained. One first insertion guide 30 corresponds to one solenoid coil 15, and the first insertion guide 30 is used to guide the two terminals 18 of each of the solenoid coils 15.

As shown in FIG. 2 and FIG. 3, two first insertion guides 30 are provided on the upper surface 7a. These first insertion guides 30 are disposed so as to correspond to the positions of the solenoid coils 15, and in the present embodiment, these are disposed so as to be opposed to each other in positions close to the back side part 2d from the middle position between the front side part 2c and the back side part 2d of the case 2.

Figure 5:
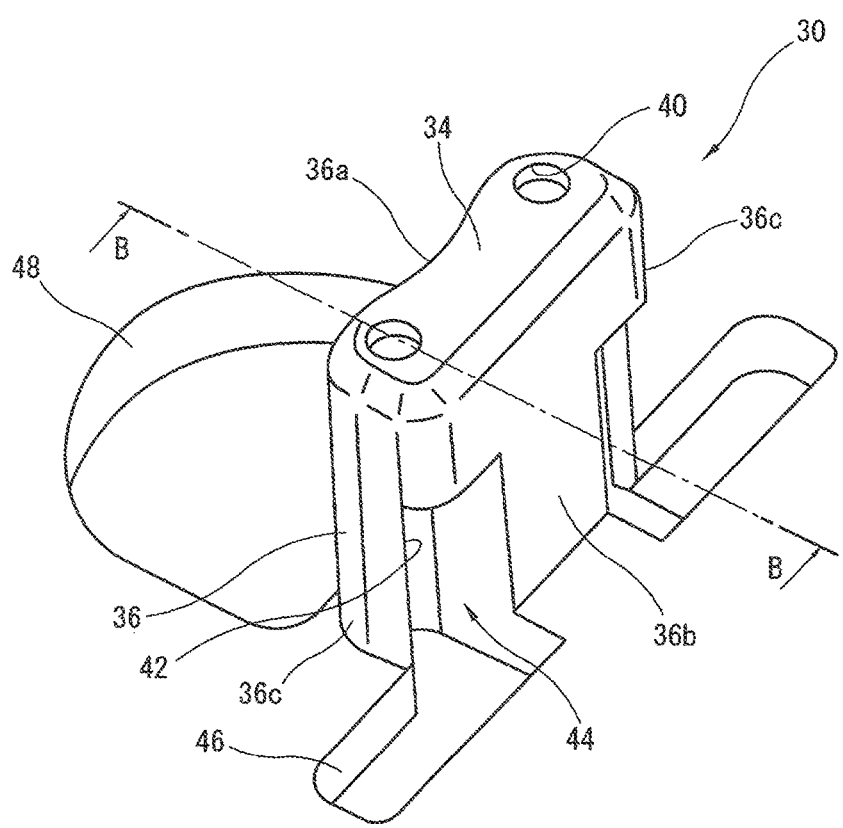
FIG. 5 is a perspective view of a first insertion guide according to the present invention.
Figure 6:
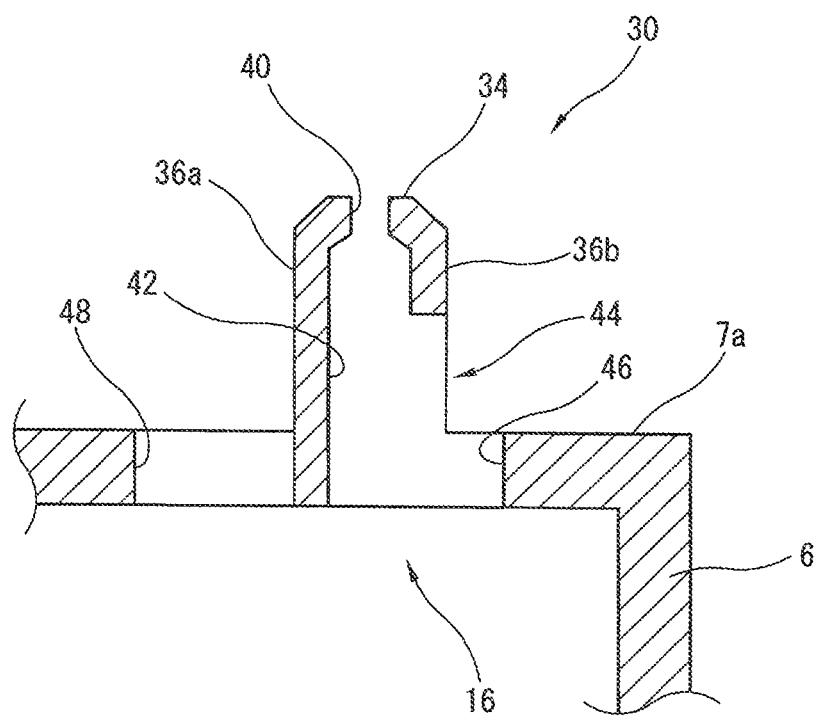
FIG. 6 is a sectional view of the first insertion guide taken along a line B-B of FIG. 5.

As shown in FIG. 5 and FIG. 6, each of the first insertion guides 30 vertically rises up in the form of a concave shape from the upper surface 7a toward the circuit board 3, and has a flat top section wall 34 and a peripheral wall 36 extending vertically from the upper surface 7a to the top section wall 34. That is, the first insertion guide 30 has a flat cylindrical shape so as to surround the two terminals 18. The peripheral wall 36 is formed of a front surface part 36a toward a coil center side, a back surface part 36b toward a coil outer peripheral side, and a pair of side surface parts 36c connecting the front surface part 36a with the back surface part 36b.

Figure 7:
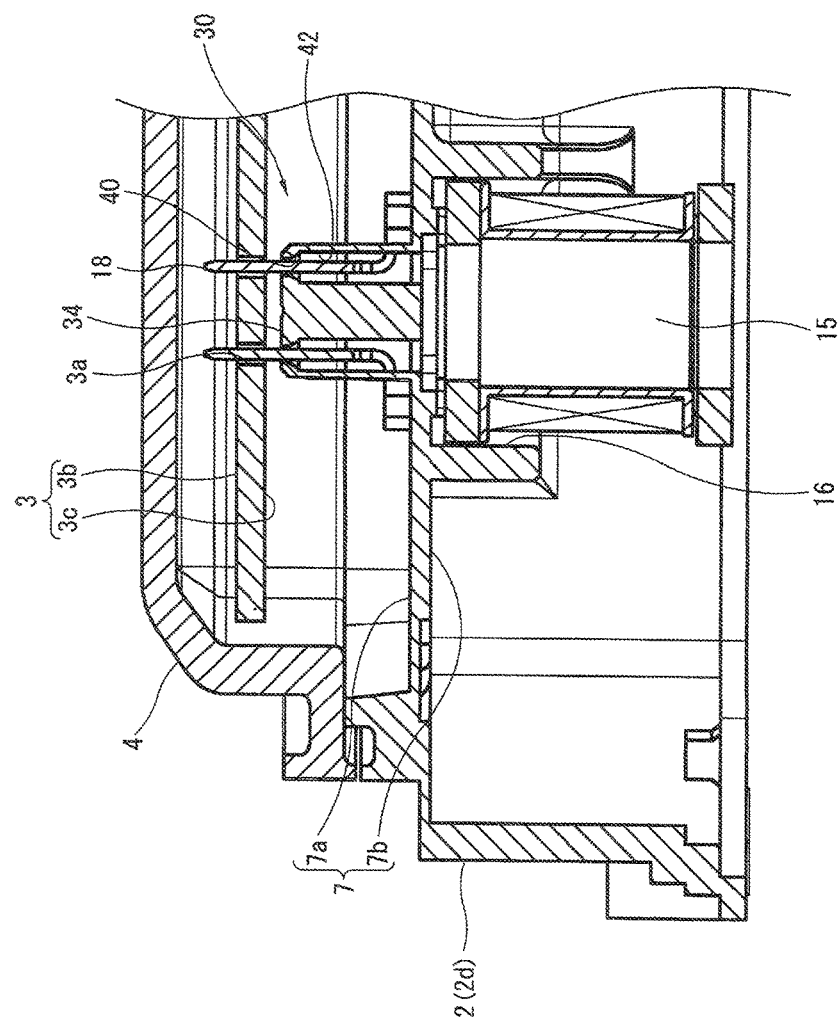
FIG. 7 is a sectional view of the electronic control device taken along a line C-C of FIG. 3, and is a drawing showing the first insertion guide.

The top section wall 34 has an elongated shape. A circular guide hole 40 through which the terminal 18 is inserted is opened through each of both the end portions in the longitudinal direction of the top section wall 34. The distance between the two guide holes 40 is set in accordance with the distance between the two terminals 18 that are inserted. As shown in FIG. 7, the guide hole 40 is formed in a tapered shape so that the diameter of a part at the outer side (the top surface side) of the guide hole 40 is small, to facilitate the insertion of the terminal 18. The inner diameter of the small diameter part of the guide hole 40 is set smaller than the inner diameter of the through hole 3a.

The inner side of the peripheral wall 36 is formed with two guide grooves 42, and each of the guide grooves 42 surrounds at least three sides of each of the terminals 18. Each of the guide grooves 42 is communicated with the coil accommodating part 16, and vertically extends so as to be continuous with the guide groove 40. The width of each of the guide grooves 42 is the same as the inner diameter at the large diameter part of the guide hole 40.

The back surface part 36b is formed with substantially rectangular opening portions 44 formed at both of the respective end portions in the longitudinal direction of the back surface part 36b, in the upper surface 7a side. That is, in a cross section along the guide groove 42, the first insertion guide 30 has an inverted-L shape in cross section which has a part opened to one side. The opening portion 44 is continuous with the guide groove 42, and a part of the guide groove 42 is opened through this opening portion 44.

In the back surface part 36b side of each of the first insertion guides 30, two rectangular opening portions 46 communicating with the coil accommodating part 16 are opened on the bottom wall section 7. The opening portion 46 is continuous with the opening portion 44 and the guide groove 42, and extends outward in the form of an elongated shape from each of both the end portions in the longitudinal direction of the first insertion guide 30. In addition, in the front surface part 36a side, a substantially circular opening portion 48 opening to the coil accommodating part 16 is opened on the bottom wall section 7. The back surface part 36b has a flat shape. In contrast to this, the middle part of the front surface part 36a is hollowed along the outer edge of the opening portion 48.

In addition, the height of the first insertion guide 30 is set so that the top section wall 34 does not interfere with a solder fillet formed on the lower surface 3c (see FIG. 7), which is not shown in the drawings, when the circuit board 3 is mounted on the case 2. It is preferable that the top section wall 34 is adjacent to the lower surface 3c in a range not interfering with the solder fillet. In the present embodiment, the height of the solder fillet is, for example, approximately 0.5 mm.

Figure 8:
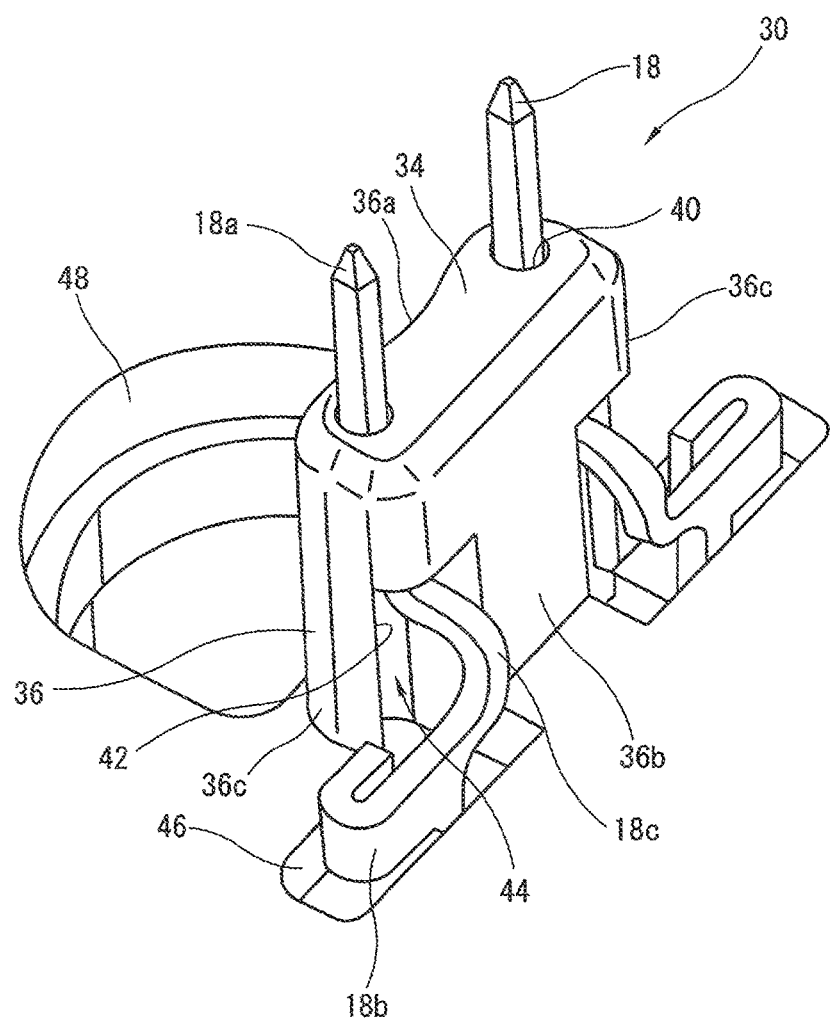
FIG. 8 is a perspective view of the first insertion guide in a state in which terminals have been inserted.

FIG. 8 shows a state in which the terminals 18 have been inserted into the first insertion guide 30. The terminal 18 passes through the guide groove 42, and a tip end portion 18a of the terminal 18 projects from the first insertion guide 30 through the guide hole 40. In addition, a base part 18b of the terminal 18 projects upward from the opening portion 46, and a bending part 18c of the terminal 18 projects sideways from the opening portion 44.

Next, with reference to FIG. 2 to FIG. 4 and FIG. 9 to FIG. 12, the second insertion guide 50 will be explained. The first insertion guide 30 is one to guide the terminals 18 of one solenoid coil 15. In contrast to this, the second insertion guide 50 is one to guide the terminals 18 of two solenoid coils 15, and the second insertion guide 50 has a structure in which, for example, two first insertion guides 30 are combined. That is, the second insertion guide 50 is configured as a rectangular projection having a size substantially corresponding to two first insertion guides 30.

As shown in FIG. 2 and FIG. 3, four second insertion guides 50 are provided on the upper surface 7a. These four second insertion guides 50 are arranged corresponding to the positions of the solenoid coils 15, and in the present embodiment, those are arranged close to the front side part 2c and between the first side part 2a and the second side part 2b, in a line at predetermined intervals from each other. Eight coil accommodating parts 16 are arranged in two lines in the form of "2×4", in which each of the lines has four coil accommodating parts 16, at the undersides of the second insertion guides 50, and each of the second insertion guides 50 is arranged between a pair of the adjacent coil accommodating parts 16.

Figure 12:
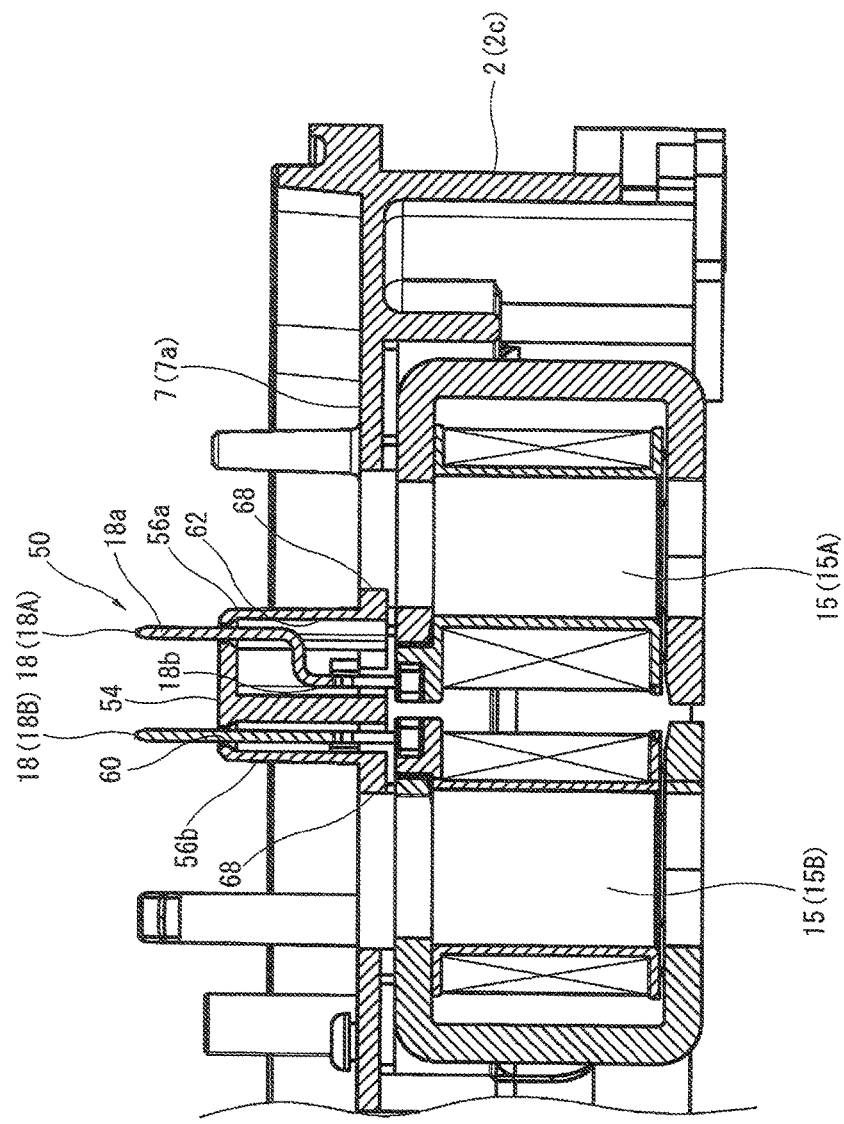
FIG. 12 as a sectional view of the second insertion guide taken along a line D-D of FIG. 3.

As shown in FIG. 12, one side surfaces of the part of the solenoid coils 15, one side surfaces at which the terminals 18 are provided, are arranged back to back, and a total of four terminals 18 of the pair of the solenoid coils 15 are inserted into one second insertion guide 50. Here, in FIG. 12 and the following explanation, one of the pair of the solenoid coils 15 arranged back to back is determined as a solenoid coil 15A, and the other is determined as a solenoid coil 15B, to distinguish therebetween as needed.

Figure 9:
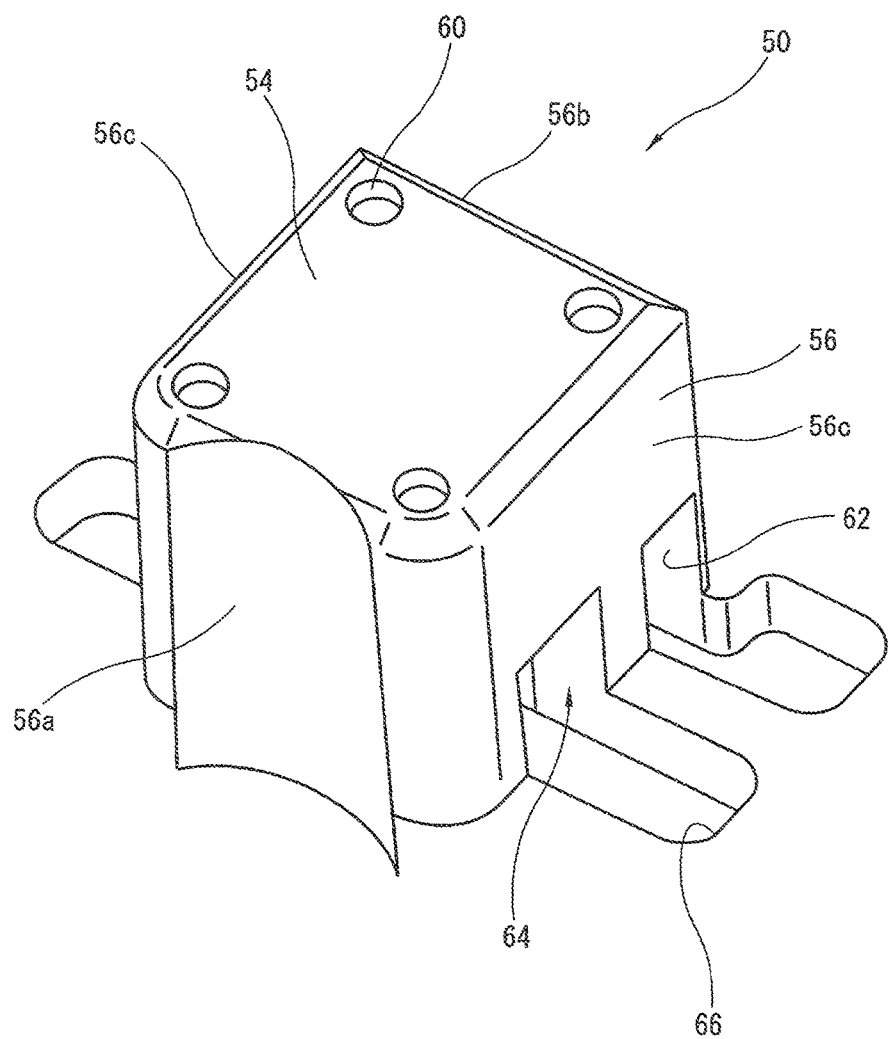
FIG. 9 is a perspective view of a second insertion guide according to the present invention.
Figure 10:
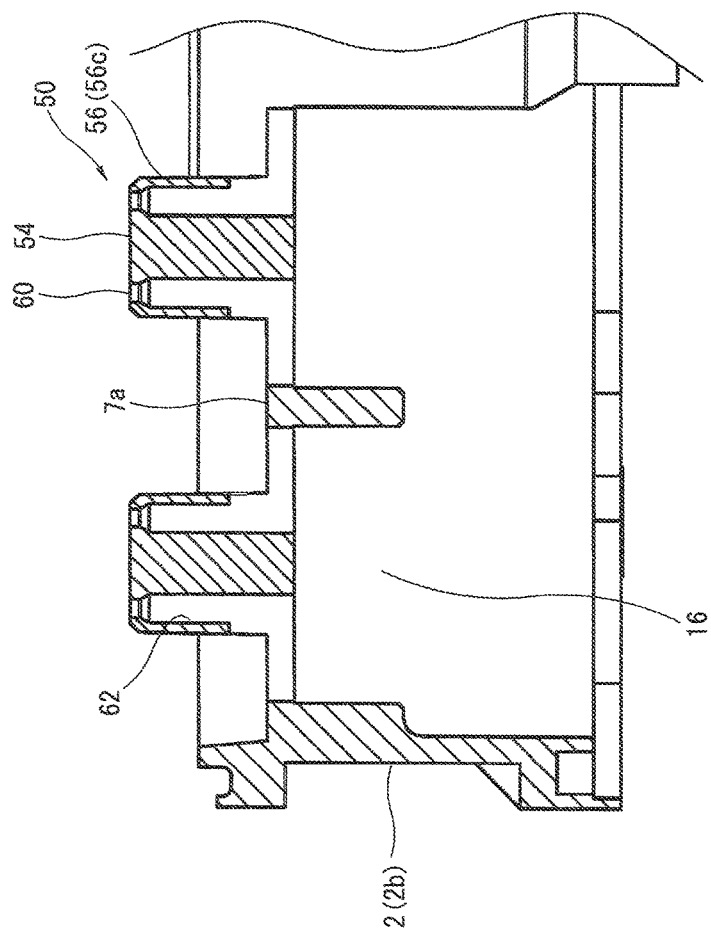
FIG. 10 is an enlarged sectional view of E part shown in FIG. 4, and is a drawing showing the second insertion guide in a state in which solenoid coils have been removed.

As shown in FIG. 9 and FIG. 10, each of the second insertion guides 50 rises up in the form of a substantially square convex shape from the upper surface 7a toward the circuit board 3, and has a flat top section wall 54 and a peripheral wall 56 vertically extending from the upper surface 7a to the top section wall 54. The peripheral wall 56 is formed of a first front surface part 56a toward the center of the one solenoid coil 15A (see FIG. 12), a second front surface part 56b toward the center of the other solenoid coil 15B (see FIG. 12), and a pair of side surface parts 56c connecting the first front surface part 56a with the second front surface part 56b.

As shown in FIG. 9, the top section wall 54 has a substantially square shape, and a circular guide hole 60 through which the terminal 18 is inserted is opened at each of the four corners of the top section wall 54. The distance between two guide holes 60 arranged at the first front surface part 56a side is set corresponding to the distance between two terminals 18 that are inserted into the respective two guide holes 60 arranged at the first front part 56a side, and the distance between two guide holes 60 arranged at the second front surface part 56b side is set corresponding to the distance between two terminals 18 that are inserted into the respective two guide holes 60 arranged at the second front part 56b side. As shown in FIG. 10, the guide hole 60 has a tapered shape so that the diameter of a part at the outer side (the top surface side) of the guide hole 60 is small, to facilitate the insertion of the terminal 18. The inner diameter of the small diameter part of this guide hole 60 is set smaller than the inner diameter of the through hole 3a.

The inner side of the peripheral wall 56 is formed with four guide grooves 62, and each of the guide grooves 62 surrounds at least three sides of each of the terminals 18. Each of the guide grooves 62 communicates with the coil accommodating part 16, and vertically extends so as to be continuous with the guide hole 60. The width in a side surface part 65c direction of each of the guide grooves 62 is substantially the same as the inner diameter in the large diameter part of the guide groove 60. In addition, the four guide grooves 62 are independent of each other.

As shown in FIG. 9, in the upper surface 7a side, two substantially rectangular opening parts 64 are formed at both of the respective end portions of each of the pair of the side surface parts 56c. The opening part 64 is continuous with the guide groove 62, and a part of each of the guide grooves 62 is opened through the opening part 64.

Here, in FIG. 12, that is, when the second insertion guide 50 is viewed from a direction along a D-D line of FIG. 3, in contrast to a terminal 18B of the one solenoid coil 15B extending straightly upwardly, a terminal 18A of the other solenoid coil 15A is bent at the middle part thereof in a direction away from the terminal 18B, and extends upward in the form of an offset. Consequently, the guide groove 62 at the first front surface part 56a side which corresponds to the solenoid coil 15A and the guide groove 62 at the second front surface part 56b side which corresponds to the solenoid coil 15B are formed asymmetrically to each other. As shown in FIG. 12, in contrast to the guide groove 62 corresponding to the terminal 18B which has a relatively narrow cylindrical shape, the guide groove 62 corresponding to the terminal 18A is one in which the dimension of the guide groove 62 along the line D-D of FIG. 3 is large.

As shown in FIG. 9, in each of both the side surface part 56c sides of the second insertion guide 50, two opening parts 66 continuing with the opening parts 64 and the guide groves 62 are opened on the bottom wall section 7. Each of the opening parts 66 communicates with the coil accommodating part 16, and extends outward in the form of an elongated shape from both the side surface parts 56c. In addition, as shown in FIG. 12, a substantially circular opening part 68 opening to the coil accommodating part 16 is opened on the bottom wall section 7 at each of the first front surface part 56a side and the second front surface part 56b side. The side surface parts 56c and the second front surface part 56b are formed in flat shapes. In contrast to this, the middle part of the first front surface part 56a is hollowed along the outer edge of the opening part 68.

In addition, the height of the second insertion guide 50 is the same as the height of the first insertion guide 30, and is set so that the top section wall 54 does not interfere with a solder fillet formed on the lower surface 3c, which is not shown in the drawings, when the circuit board 3 is mounted on the case 2. It is preferable that the top section wall 54 is adjacent to the lower surface 3c in a range not interfering with the solder fillet.

Figure 11:
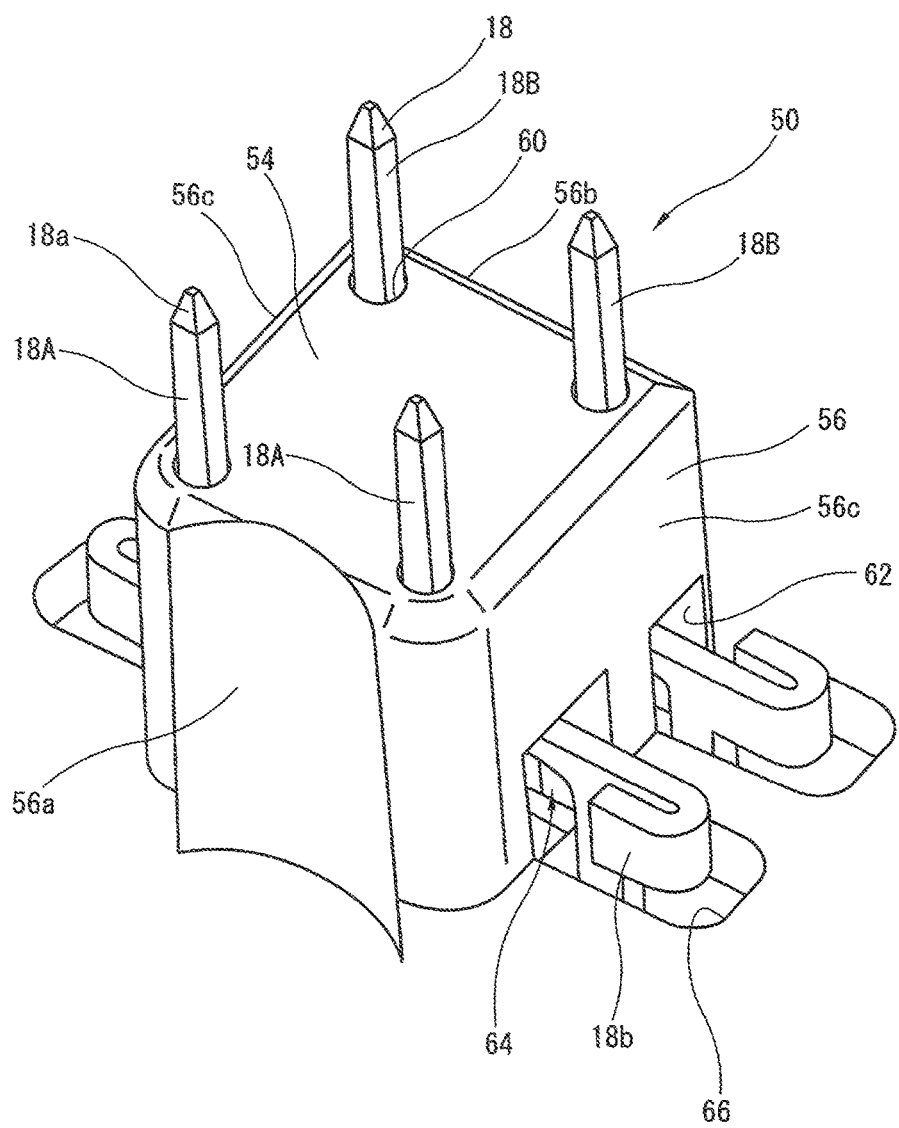
FIG. 11 is a perspective view of the second insertion guide in a state in which the terminals have been inserted.

FIG. 11 shows a state in which a total of four terminals 18 (18A, 18B) of a pair of the solenoid coils 15 have been inserted into the second insertion guide 50. The terminal 18 passes through the guide groove 62, and the tip end portion 18a projects from the second insertion guide 50 through the guide hole 60. In addition, the base part 18b of the terminal 18 projects upward from the opening part 66, and projects sideways from the opening part 64.

Next, a guide effect for the terminal 18 by the first insertion guide 30 and the second insertion guide 50 will be explained.

As shown in FIG. 7 and FIG. 8, the terminal 18 of the solenoid coil 15 accommodated at the underside of the first insertion guide 30 passes through the bottom wall section 7, and is inserted into the first insertion guide 30 through the guide groove 42 from the bottom section of the first insertion guide 30. After this, the terminal 18 is guided to the guide hole 40 by the guide groove 42, and projects from the first insertion guide 30 through the guide hole 40. Similar to this, as shown in FIG. 11 and FIG. 12, the terminal 18 of the solenoid coil 15 accommodated at the underside of the second insertion guide 50 passes through the bottom wall section 7; and is inserted into the second insertion guide 50 through the guide groove 62 from the bottom section of the second insertion guide 50. After this, the terminal 18 is guided to the guide hole 60 by the guide groove 62, and projects from the second insertion guide 50 through the guide hole 60. The circuit board 3 is disposed adjacent to the top section walls 34 and 54, and the guide holes 40 and 60 and through holes 3a are aligned, and the terminal 18 projecting from the first insertion guide 30 and the terminal 18 projecting from the second insertion guide 50 are guided to and inserted into the respective through holes 3a.

According to the present embodiment, since the insertion guides 30 and 50 rise up from the upper surface 7a of the bottom section 7 to the vicinity of the circuit board 3, and the guide hole 40 is opened on the top section wall 34 of the insertion guide 30 and the guide hole 60 is opened on the top section wall 54 of the insertion guide 50, the terminals 18 can be easily inserted into the through holes 3a of the circuit board 3.

Moreover, according to the present embodiment, since the insertion guide 30 is formed in the inverted-L shape in cross section which has a part opened toward one side, it is possible to project the bending part 18c of the terminal 18 sideways from this opened part of the insertion guide 30.

In addition, according to the present embodiment, since the insertion guide 30 has the guide grooves 42, and the insertion guide 50 has the guide grooves 62, and each of the guide grooves 42 and 62 is formed so as to surround the three sides of the terminal 18, and the guide holes 40 and 60 are formed so as to be continuous with the respective guide grooves 42 and 62, the terminal 18 can be guided to the guide hole 40 by passing through the guide groove 42, and the terminal 18 can be guided to the guide hole 60 by passing through the guide groove 62.

According to the present embodiment, since a pair of the guide holes 40 is opened on the top section wall 34 of the insertion guide 30, and each of a pair of the terminals 18 of one solenoid coil 15 can be inserted into one of the guide holes 40, it is possible to easily insert each of the pair of the terminals 18 into one of the through holes 3a of the circuit board 3.

Furthermore, according to the present embodiment, since two pairs of guide grooves 60 are opened on the top section wall 54 of the second insertion guide 50, and the terminals 18 can be inserted into the respective guide holes 60 in a state in which the back surfaces of two solenoid coils 15 have been butted to each other, it is possible to arrange the two solenoid coils 15 more adjacently to each other, and to easily form the insertion guide, as compared with a case where an insertion guide corresponding to one solenoid coil 15 is individually formed.

In addition, according to the present embodiment, since the height of each of the insertion guides 30 and 50 is set so as not to interfere with the solder fillet on the circuit board 3, and it is not interfere with other electronic components mounted on the surface of the circuit board 3, and the circuit board 3 and the top section wall 34, and the circuit board 3 and the top section wall 54 are adjacent, it is possible to easily insert the terminals 18 into the respective through holes 3a.

Second Embodiment

Next, with reference to FIG. 13 to FIG. 15, another embodiment of the present invention will be explained. In the present embodiment, in addition to the first insertion guide 30 and the second insertion guide 50, an insertion guide plate 70 is used.

Figure 13:
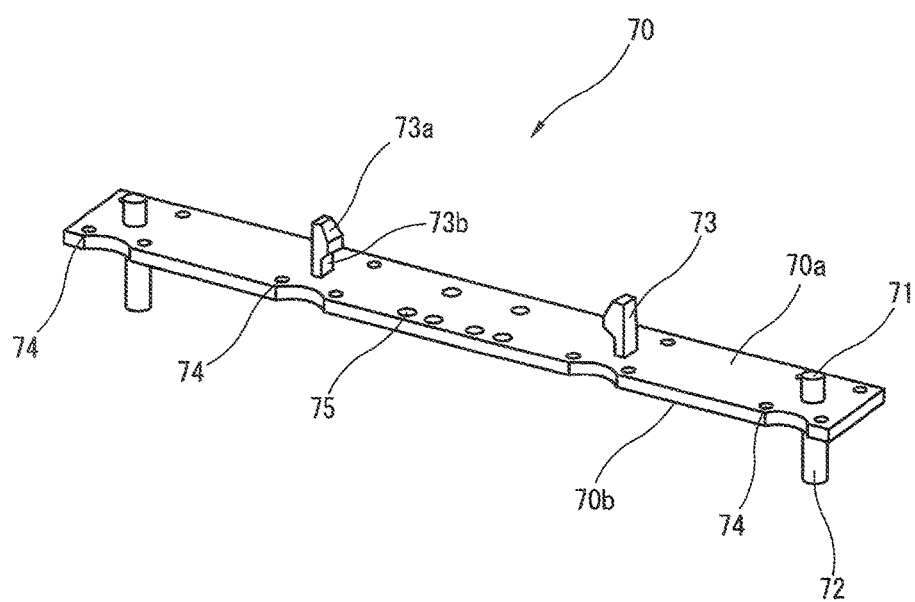
FIG. 13 is a perspective view of an insertion guide plate according to the present invention.
Figure 14:
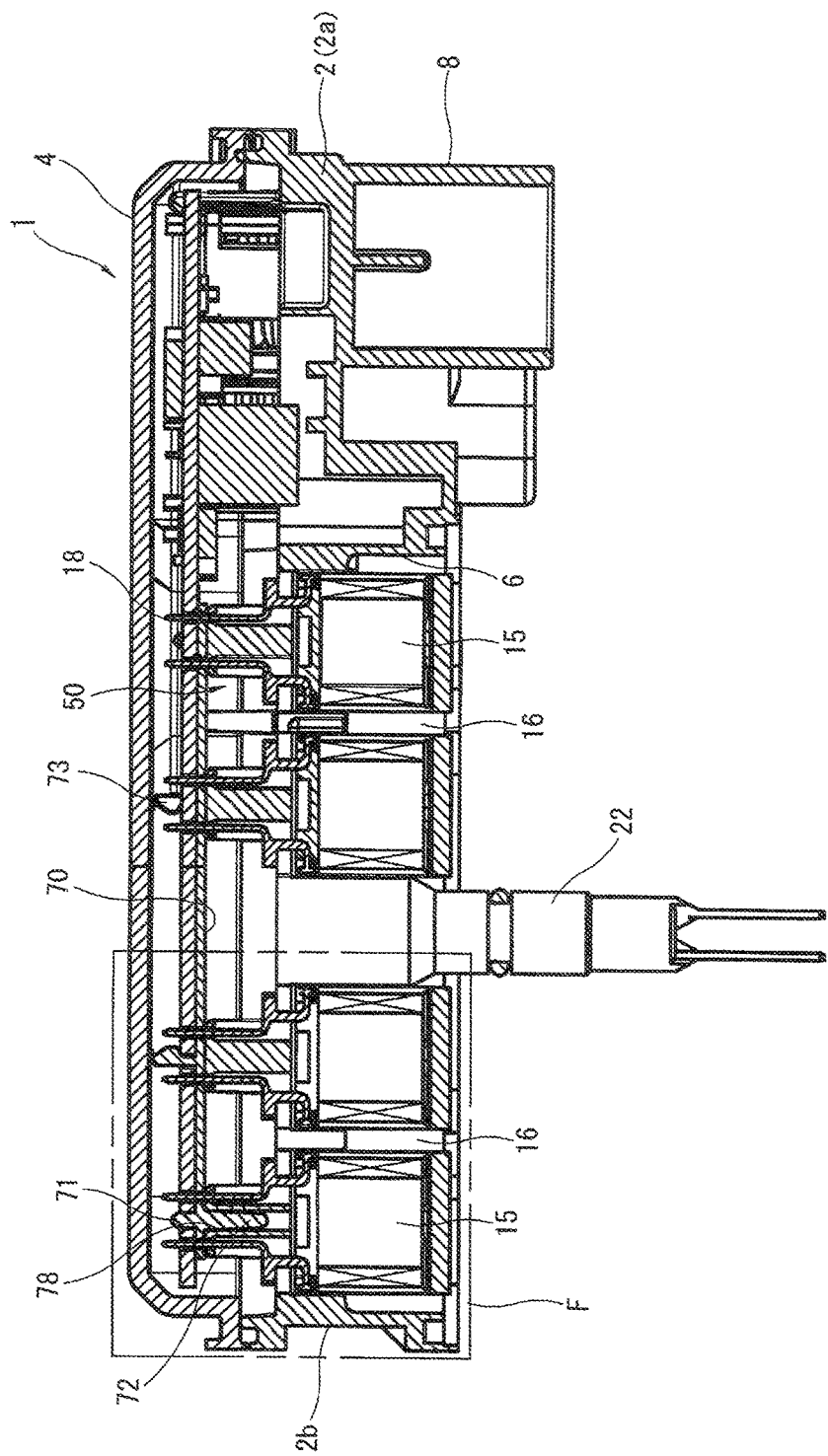
FIG. 14 is a sectional view of the insertion guide plate and the second insertion guide, which is similar to FIG. 4.

As shown in FIG. 13 and FIG. 14, the insertion guide plate 70 formed in a rectangular thin plate shape and made of synthetic resin has a length to cover the top section walls 54 of four second insertion guides 50, and has the substantially same width as the width in the longitudinal direction of the top section wall 54. The insertion guide plate 70 has a pair of first positioning pins 71 as a positioning portion to the circuit board 3, a pair of second positioning pins 72 as a positioning portion to the case 2, and a pair of fixing hooks 73 to attach the insertion guide plate 70 to the circuit board 3.

The first positioning pin 71 used for positioning the insertion guide plate 70 to the circuit board 3 is disposed at each of both the end portions of the insertion guide plate 70, and they vertically project from an upper surface 70a facing the circuit board 3. The second positioning pin 72 used for positioning the circuit board 3 to the second insertion guide 50, namely, the case 2 is disposed coaxially with the first positioning pin 71 in each of both the end portions of the insertion guide plate 70, and they vertically project from a lower surface 70b at the second insertion guide 50 side. The first positioning pin 71 and the second positioning pin 72 are formed in columnar shapes.

The fixing hooks 73 are arranged between the pair of the first positioning pins 71, and vertically project from the upper surface 70a. As shown in FIG. 14, the positions of the fixing hooks 73 are set to the positions above two second insertion guides 50 positioned inside, when the insertion guide plate 70 is attached. Each of the fixing hooks 73 has a claw portion 73a formed at the tip end of the fixing hook 73, and a neck portion 73b at the base portion side of the fixing hook 73. The upper surface and the lower surface of the claw portion 73a are inclined, and the claw portion 73a has a mountain shape, to engage with the circuit board 3. The neck portion 73b has a rectangular shape in cross section. The pair of the fixing hooks 73 is opposed to each other so that the top portions of the respective claw portions 73a face inside.

Moreover, in the insertion guide plate 70, four circular guide holes 74 to guide the respective terminals 18 are opened around each of the positioning pins 71 and 72, and the fixing hooks 73. As shown in FIG. 14, when the insertion guide plate 70 is attached, the guide holes 74 are positioned immediately under the respective through holes 3a, and positioned immediately above the respective guide holes 60 of the second insertion hole 50. Moreover, as shown in FIG. 15, each of the guide holes 74 has a tapered shape so that the diameter of the guide hole 74 at the upper surface 70a side becomes small. In addition, a plurality of through holes 75 through which a plurality of terminals of other electronic components are inserted are opened on the insertion guide plate 70.

Figure 15:
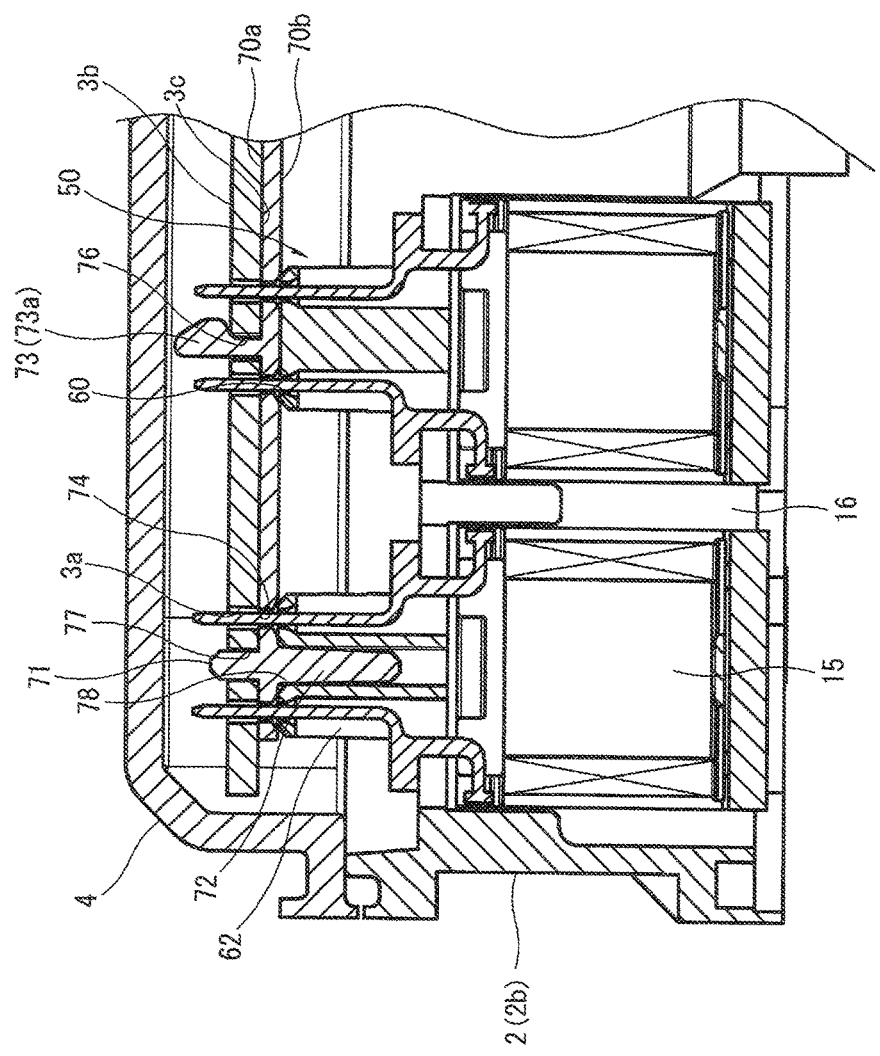
FIG. 15 is an enlarged sectional view of F part shown in FIG. 14.

In the present embodiment, as shown in FIG. 14 and FIG. 15, two rectangular through holes 76 through which the respective fixing hooks 73 are inserted and two circular through holes 77 through which the respective first positioning pins 71 are inserted are opened on the circuit board 3. The through hole 76 is arranged at the substantially center of four through holes 3a corresponding to each of the second insertion guides 50, and the through hole 77 is arranged at the substantially center of four through holes 3a corresponding to each of the second insertion guides 50. Furthermore, as shown in FIG. 15, each of two second insertion guides 50 positioned outside is formed with a positioning hole 78 through which the second positioning pin 72 is inserted. Each of the positioning holes 78 is disposed at the center of the top section wall 54, and vertically extends independent of the guide groove 62.

The first engaging pin 71 is inserted into the through hole 77, and the fixing hook 73 is inserted into the through hole 76, and the lower surface of the claw portion 73a engages with the upper surface 3b of the circuit board 3, and thereby the insertion guide plate 70 configured above is fixed to the circuit board 3.

When the circuit board 3 is attached to the case 2, by inserting the second positioning pin 72 into the positioning hole 78, the insertion guide plate 70 and the circuit board 3 are positioned to the second insertion guide 50, namely, the case 2, and the circuit board 3 is attached to the case 2 by the snap fit portions 11. At this time, the insertion guide plate 70 is disposed between the circuit board 3 and the second insertion guide 50 in a state in which the upper surface 70a and the lower surface 3c of the circuit board 3 have been brought into tight contact with each other, and in a state in which the lower surface 70b and the top surface of the second insertion guide 50 have been brought into tight contact with each other.

Next, with reference to FIG. 14 and FIG. 15, a guide effect for the terminal 18 by the insertion guide plate 70 will be explained.

The terminal 18 inserted into the second insertion guide 50 is guided to the guide hole 60 by the guide groove 62, and projects from the second insertion guide 50 through the guide hole 60. The insertion guide plate 70 is disposed tightly between the circuit board 3 and the second insertion guide 50, and the guide hole 60, the guide hole 74 and the through hole 3a are aligned, and thereby the terminal 18 projecting from the second insertion guide 50 is guided to the through hole 3a by the guide hole 74, and passes through the through hole 3a.

According to the present embodiment, in addition to the second insertion guide 50, by using the insertion guide plate 70, the clearance between the circuit board 3 and the second insertion guide 50 is eliminated, and the guide hole 60, guide hole 74 and the through hole 3a are continued. Consequently, it is possible to insert the terminal 18 into the through hole 3a more easily. Moreover, the guide hole 74 is formed in a tapered shape in which the diameter of the guide hole 74 at the circuit board 3 side becomes small, and thereby it is possible to insert the terminal 18 into the guide hole 74 more easily.

As the above, although the embodiments of the present invention have been explained, the present invention is not limited to the above embodiments, and can be changed and modified.

In the above embodiments, the present invention has been applied to an electronic control device for an electronic stability control (ESC). However, the present invention is not limited to this. The present invention may be applied to other electronic control devices.

In addition, in the above embodiments, although two first insertion guides 30 and four second insertion guides 50 are provided on the bottom wall section 7, the number of the insertion guide 30 and the number of the insertion guide 50 are not limited to the above numbers.

Moreover, the shapes of the insertion guides 30 and 50, and the shapes of the guide holes 40, 60 and 74 are not limited to the shapes of the above embodiments, and they may be formed in other shapes.

In addition, in the above embodiments, although the insertion guide plate 70 is applied to the second insertion guide 50, it can be also applied to the first insertion guide 30.

As an electronic control device based on the embodiments explained above, for example, aspects described below can be considered.

An electronic control device includes a case made of synthetic resin and a circuit board fixed to the case, and the case has a first surface opposite to the circuit board and a second surface on an opposite side to the first surface, and a terminal of an electronic component disposed on the second surface is fixed to a through hole of the circuit board through the case. The first surface is formed with an insertion guide rising up in a form of a concave shape from the first surface toward the circuit board, and a guide hole through which the terminal is inserted is opened on a top section wall of the insertion guide.

In a preferable aspect of the electronic control device, the insertion guide includes the top section wall and a peripheral wall extending from the first surface toward the top section wall, and is formed in an inverted-L shape in cross-section which has a part opened to one side.

In an another preferable aspect, in any of aspects of the electronic control device, the terminal of the electronic component is bent so as to project sideways from the opened part of the insertion guide.

In a further another preferable aspect, in any of aspects of the electronic control device, the insertion guide includes a groove formed so as to surround three sides of the terminal, and the guide hole is formed to be continuous with the groove.

In a further another preferable aspect, in any of aspects of the electronic control device, a pair of the guide holes is opened on the top section wall of the insertion guide, and each of a pair of the terminals of one electronic component is inserted into one of the guide holes.

In a further another preferable aspect, in any of aspects of the electronic control device, two pairs of the guide holes are opened on the top section wall of the insertion guide, and in a state in which back surfaces of two electronic components have been butted to each other, the terminals of the electronic components are inserted into the respective guide holes.

In a further another preferable aspect, in any of aspects of the electronic control device, the height of the top section wall of the insertion guide is set so as not to interfere with a solder fillet on the surface of the circuit board opposite to the insertion guide.

In a further another preferable aspect, in any of aspects of the electronic control device, the electronic control device further includes an insertion guide plate having a plurality of through holes through which the respective terminals of the electronic components are inserted, a positioning part to the circuit board and a positioning part to the case, and the through hole is formed in a tapered shape in which the diameter of a part at the circuit board side of the through hole is small.

The invention claimed is:

1. An electronic control device, comprising:
    a case made of synthetic resin; and
    a circuit board fixed to the case, wherein
        the case includes a first surface opposite to the circuit board and a second surface on an opposite side to the first surface,
        a terminal of an electronic component disposed on the second surface is fixed to a through hole of the circuit board through the case,
        the first surface is formed with an insertion guide rising up in a form of a concave shape from the first surface toward the circuit board,
        a guide hole through which the terminal is inserted is opened on a top section wall of the insertion guide, and
        the top section wall of the insertion guide is in a non-contact state to the circuit board.

2. The electronic control device according to claim 1, wherein the insertion guide includes the top section wall and a peripheral wall extending from the first surface to the top section wall, and
    wherein the insertion guide is formed in an inverted-L shape in cross section which has a part opened to one side.

3. The electronic control device according to claim 2, wherein the terminal of the electronic component is bent so as to project sideways from the opened part of the insertion guide.

4. The electronic control device according to claim 2, wherein the insertion guide includes a groove formed so as to surround three sides of the terminal, and
    wherein the guide hole is formed to be continuous with the groove.

5. The electronic control device according to claim 1, wherein a pair of the guide holes is opened on the top section wall of the insertion guide, and
    wherein each of a pair of the terminals of one electronic component is inserted into one of the guide holes.

6. The electronic control device according to claim 1, wherein two pairs of the guide holes are opened on the top section wall of the insertion guide, and
    wherein in a state in which back surfaces of two electronic components have been butted to each other, the terminals of the electronic components are inserted into the respective guide holes.

7. The electronic control device according to claim 1, wherein height of the top section wall of the insertion guide is set so as not to interfere with a solder fillet on a surface of the circuit board opposite to the insertion guide.

8. The electronic control device according to claim 1, further comprising an insertion guide plate including:
    a plurality of through holes through which the respective terminals of the electronic components are inserted;
    a positioning part to the circuit board; and
    a positioning part to the case,
    wherein the through hole is formed in a tapered shape in which a diameter of a part at the circuit board side of the through hole is small.

9. An electronic control device, comprising:
    a case made of synthetic resin; and
    a circuit board fixed to the case, wherein
        the case includes a first surface opposite to the circuit board and a second surface on an opposite side to the first surface,
        a terminal of an electronic component disposed on the second surface is fixed to a through hole of the circuit board through the case,
        the first surface is formed with an insertion guide rising up in a form of a concave shape from the first surface toward the circuit board,
        two pairs of the guide holes are opened on the top section wall of the insertion guide, and
        in a state in which back surfaces of two electronic components have been butted to each other, the terminals of the electronic components are inserted into the respective guide holes.

10. The electronic control device according to claim 9, wherein the insertion guide includes the top section wall and a peripheral wall extending from the first surface to the top section wall, and
    wherein the insertion guide is formed in an inverted-L shape in cross section which has a part opened to one side.

11. The electronic control device according to claim 10, wherein the terminal of the electronic component is bent so as to project sideways from the opened part of the insertion guide.

12. The electronic control device according to claim 10, wherein the insertion guide includes a groove formed so as to surround three sides of the terminal, and
    wherein the guide hole is formed to be continuous with the groove.

13. The electronic control device according to claim 9, wherein a pair of the guide holes is opened on the top section wall of the insertion guide, and
    wherein each of a pair of the terminals of one electronic component is inserted into one of the guide holes.

14. The electronic control device according to claim 9, wherein height of the top section wall of the insertion guide is set so as not to interfere with a solder fillet on a surface of the circuit board opposite to the insertion guide.

15. The electronic control device according to claim 9, further comprising an insertion guide plate including:
- a plurality of through holes through which the respective terminals of the electronic components are inserted;
- a positioning part to the circuit board; and
- a positioning part to the case, wherein
  the through hole is formed in a tapered shape in which a diameter of a part at the circuit board side of the through hole is small.

* * * * *